(12) United States Patent
Lyu et al.

(10) Patent No.: US 11,391,802 B2
(45) Date of Patent: Jul. 19, 2022

(54) SYSTEMS AND METHODS FOR MAGNETIC RESONANCE IMAGING RECONSTRUCTION

(71) Applicant: SHANGHAI UNITED IMAGING INTELLIGENCE CO., LTD., Shanghai (CN)

(72) Inventors: Xuyang Lyu, Shanghai (CN); Shu Liao, Shanghai (CN)

(73) Assignee: SHANGHAI UNITED IMAGING INTELLIGENCE CO., LTD., Shanghai (CN)

( * ) Notice: Subject to any disclaimer, the term of this patent is extended or adjusted under 35 U.S.C. 154(b) by 0 days.

(21) Appl. No.: 17/137,489

(22) Filed: Dec. 30, 2020

(65) Prior Publication Data
US 2021/0199742 A1   Jul. 1, 2021

(30) Foreign Application Priority Data
Dec. 31, 2019   (CN) .......................... 201911419035.8

(51) Int. Cl.
*G01V 3/00*    (2006.01)
*G01R 33/56*   (2006.01)
*G01R 33/561*  (2006.01)

(52) U.S. Cl.
CPC ...... *G01R 33/5608* (2013.01); *G01R 33/5611* (2013.01)

(58) Field of Classification Search
CPC .............. G01R 33/543; G01R 33/5659; G01R 33/3415; G01R 33/36; A61B 5/055
USPC ......................................................... 324/309
See application file for complete search history.

(56) References Cited

U.S. PATENT DOCUMENTS

| 2017/0295325 A1* | 10/2017 | Yoon .................. H04N 5/23245 |
| 2018/0060722 A1* | 3/2018 | Hwang ................ G06N 3/0454 |
| 2018/0260479 A1* | 9/2018 | Wang .................. G06K 9/6202 |

(Continued)

OTHER PUBLICATIONS

Mark A. Griswold et al., Generalized Autocalibrating Partially Parallel Acqusitions (GRAPPA), Magnetic Resonance in Medicine, 47: 1202-1210, 2002.

(Continued)

*Primary Examiner* — Walter L Lindsay, Jr.
*Assistant Examiner* — Frederick Wenderoth
(74) *Attorney, Agent, or Firm* — Metis IP LLC

(57) ABSTRACT

A method for MRI reconstruction is provided. The method may include obtaining a plurality of sub-sampled images of a subject. The plurality of sub-sampled images may include a first sub-sampled image of the subject and one or more second sub-sampled images of the subject. The first sub-sampled image may be generated using a first MRI sequence and a first sub-sampling rate. Each of the one or more second sub-sampled images may be generated using a second MRI sequence and a second sub-sampling rate. The second sub-sampling rate may be smaller than the first sub-sampling rate. The method may include obtaining an image reconstruction model having been trained according to a machine learning technique. The method may further include generating a first full image of the subject corresponding to the first MRI sequence based on the first sub-sampled image, the one or more second sub-sampled images, and the image reconstruction model.

20 Claims, 9 Drawing Sheets

(56) References Cited

U.S. PATENT DOCUMENTS

2018/0343017 A1* 11/2018 Kumar ................ G06N 3/0454

OTHER PUBLICATIONS

Klaas P. Pruessmann et al., SENSE: Sensitivity Encoding for Fast MRI, Magnetic Resonance in Medicine, 42: 952-962, 1999.
Ricardo Otazo et al., Combination of Compressed Sensing and Parallel Imaging for Highly Accelerated First-Pass Cardiac Perfusion MRI, Magnetic Resonance in Medicine, 64: 767-776, 2010.
Jo Schlemper et al., A Deep Cascade of Convolutional Neural Networks for MR Image Reconstruction, International Conference on Information Processing in Medical Imaging, 2017, 12 pages.

* cited by examiner

500

┌─────────────────────────────────────────────────┐
│ Obtaining a plurality of sub-sampled images of a subject, │
│ wherein the plurality of sub-sampled images include a first │ ─ 510
│ sub-sampled image of the subject and one or more second │
│ sub-sampled images of the subject │
└─────────────────────────────────────────────────┘
                        ↓
┌─────────────────────────────────────────────────┐
│ Obtaining an image reconstruction model having been trained │ ─ 520
│ according to a machine learning technique │
└─────────────────────────────────────────────────┘
                        ↓
┌─────────────────────────────────────────────────┐
│ Generating a first full image of the subject corresponding to │
│ the first MRI sequence based on the first sub-sampled image, │ ─ 530
│ the one or more second sub-sampled images, and the image │
│ reconstruction model │
└─────────────────────────────────────────────────┘

```
┌─────────────────────────────────────────────────────┐
│ For each of the one or more second sub-sampled      │
│ images, generating a second full image by           │─── 610
│ processing the second sub-sampled image using its   │
│ corresponding second trained model                  │
└─────────────────────────────────────────────────────┘
                          │
                          ▼
┌─────────────────────────────────────────────────────┐
│ Generating the first full image by processing the   │
│ one or more second full images and the first sub-   │─── 620
│ sampled image using the first trained model.        │
└─────────────────────────────────────────────────────┘
```

FIG. 6

SYSTEMS AND METHODS FOR MAGNETIC RESONANCE IMAGING RECONSTRUCTION

CROSS-REFERENCE TO RELATED APPLICATIONS

This application claims priority to Chinese Patent Application No. 201911419035.8, filed on Dec. 31, 2019, the contents of which are hereby incorporated by reference.

TECHNICAL FIELD

The disclosure generally relates to medical image processing, and more particularly, to systems and methods for image reconstruction in MRI.

BACKGROUND

Magnetic Resonance Imaging (MRI) is widely used in disease diagnosis and scientific research. However, MRI data is often acquired sequentially in k-space using an MRI system, and the traversal speed in k-space is limited by the MRI system and a Nyquist sampling theorem, which may cause a long sampling time of the MRI data in K-space and a slow imaging speed. In addition, an MRI scan is usually performed in a relatively closed space and a patient may move involuntarily during the MRI scan, which may affect the imaging quality (e.g., cause motion artifacts in a resulting image). Recently, a sub-sampling technique has been used to accelerate the imaging process in MRI. However, since the sub-sampling technique does not comply with the Nyquist sampling theorem, aliasing artifacts may be generated during an image reconstruction process. Therefore, it is desired to provide methods and systems for generating MRI images with an improved image quality using the sub-sampling technique.

SUMMARY

An aspect of the present disclosure relates to a method for MRI reconstruction. The method may include obtaining a plurality of sub-sampled images of a subject. The plurality of sub-sampled images may include a first sub-sampled image of the subject and one or more second sub-sampled images of the subject. The first sub-sampled image may be generated using a first MRI sequence and a first sub-sampling rate. Each of the one or more second sub-sampled images may be generated using a second MRI sequence and a second sub-sampling rate. The second sub-sampling rate may be smaller than the first sub-sampling rate. The method may include obtaining an image reconstruction model having been trained according to a machine learning technique. The method may further include generating a first full image of the subject corresponding to the first MRI sequence based on the first sub-sampled image, the one or more second sub-sampled images, and the image reconstruction model.

In some embodiments, the generating a first full image of the subject corresponding to the first MRI sequence may include obtaining one or more reference full images of the subject each of which is generated using one of one or more third MRI sequences. The generating a first full image of the subject corresponding to the first MRI sequence may further include generating the first full image of the subject corresponding to the first MRI sequence based on the first sub-sampled image, the one or more second sub-sampled images, the image reconstruction model, and the one or more reference full image.

In some embodiments, the image reconstruction model may include a first trained model and one or more second trained models. The first trained model may be configured to process the first sub-sampled image. Each of the one or more second trained models may be configured to process one of the one or more second sub-sampled images.

In some embodiments, the first trained model may correspond to the first MRI sequence and the first sub-sampling rate. Each of the one or more second trained models may correspond to the second MRI sequence and the second sub-sampling rate of the second sub-sampled image processed by the second trained model.

In some embodiments, in the image reconstruction model, the first trained model and the one or more second trained models may be arranged according to their respective sub-sampling rates in ascending order and sequentially connected.

In some embodiments, an input of the first trained model may include an output of each of the one or more second trained models.

In some embodiments, the generating a first full image of the subject corresponding to the first MRI sequence may include, for each of the one or more second sub-sampled images, generating a second full image by processing the second sub-sampled image using its corresponding second trained model. The generating a first full image of the subject corresponding to the first MRI sequence may further include generating the first full image by processing the one or more second full images and the first sub-sampled image using the first trained model.

In some embodiments, the one or more second sub-sampled images may include a plurality of second sub-sampled images corresponding to a plurality of second sub-sampling rates. For each of the one or more second sub-sampled images, the generating a second full image by processing the second sub-sampled image using its corresponding second trained model may include generating a ranking result by ranking the plurality of second sub-sampled images according to their respective second sub-sampling rates in ascending order, and sequentially processing the plurality of second sub-sampled images in the ranking result to generate the plurality of second full images.

In some embodiments, the image reconstruction model may be generated according to a model training process. The model training process may include obtaining a plurality of training samples each of includes a first sample sub-sampled image and one or more second sample sub-sampled images of the sample subject. The first sample sub-sampled image may be generated based on the first MRI sequence and the first sub-sampling rate. Each of the one or more second sample sub-sampled images may be generated based on one of the one or more second MRI sequences and one of the one or more second sub-sampling rates. The model training process may include obtaining a preliminary model including a first model and one or more second models. The model training process may further include generating the one or more second trained models by training the one or more second models based on the one or more second sample sub-sampled images of each of the plurality of training samples. The model training process may further include generating the first trained model by training the first model based on the first sample sub-sampled image of each of the plurality of training samples and the one or more second trained models.

In some embodiments, each of the plurality of training samples may further include one or more sample reference full images of the corresponding sample subject. Each of the one or more sample reference full images may be generated using one of the one or more third MRI sequences. The one or more second trained models and the first trained model may be generated further based on the one or more sample reference full images of each of the plurality of training samples.

In some embodiments, the generating the first trained model by training the first model may include for each of the plurality of training samples, obtaining one or more predicted images corresponding to the one or more second MRI sequences based on the one or more second trained models and the one or more second sample sub-sampled images of the training sample. The generating the first trained model by training the first model may further include generating the first trained model by training the first model based on the first sub-sampled image and the one or more predicted images of each of the plurality of training samples.

Another aspect of the present disclosure relates to a system for MRI reconstruction. The system may include at least one storage device including a set of instructions and at least one processor in communication with the at least one storage device. When executing the set of instructions, the at least one processor may be directed to perform operations. The operations may include obtaining a plurality of sub-sampled images of a subject. The plurality of sub-sampled images may include a first sub-sampled image of the subject and one or more second sub-sampled images of the subject. The first sub-sampled image may be generated using a first MRI sequence and a first sub-sampling rate. Each of the one or more second sub-sampled images may be generated using a second MRI sequence and a second sub-sampling rate. The second sub-sampling rate may be smaller than the first sub-sampling rate. The operations may include obtaining an image reconstruction model having been trained according to a machine learning technique. The operations may further include generating a first full image of the subject corresponding to the first MRI sequence based on the first sub-sampled image, the one or more second sub-sampled images, and the image reconstruction model.

A further aspect of the present disclosure relates to a non-transitory computer readable medium including executable instructions for MRI reconstruction. When the executable instructions are executed by at least one processor, the executable instructions may direct the at least one processor to perform a method. The method may include obtaining a plurality of sub-sampled images of a subject. The plurality of sub-sampled images may include a first sub-sampled image of the subject and one or more second sub-sampled images of the subject. The first sub-sampled image may be generated using a first MRI sequence and a first sub-sampling rate. Each of the one or more second sub-sampled images may be generated using a second MRI sequence and a second sub-sampling rate. The second sub-sampling rate may be smaller than the first sub-sampling rate. The method may include obtaining an image reconstruction model having been trained according to a machine learning technique. The method may further include generating a first full image of the subject corresponding to the first MRI sequence based on the first sub-sampled image, the one or more second sub-sampled images, and the image reconstruction model.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIG. 5 is a flowchart illustrating an exemplary process for generating a first full image of a subject according to some embodiment of the present disclosure;

FIG. 6 is a flowchart illustrating an exemplary process for generating a first full image of a subject according to some embodiments of the present disclosure;

FIG. 8 is a flowchart illustrating an exemplary process for generating an image reconstruction model according to some embodiments of the present disclosure; and.

DETAILED DESCRIPTION

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "device," "unit," "module," and/or "block" used herein are one method to distinguish different components, elements, parts, sections, or assembly of different levels in ascending order. However, the terms may be displaced by another expression if they achieve the same purpose.

Figure 2:
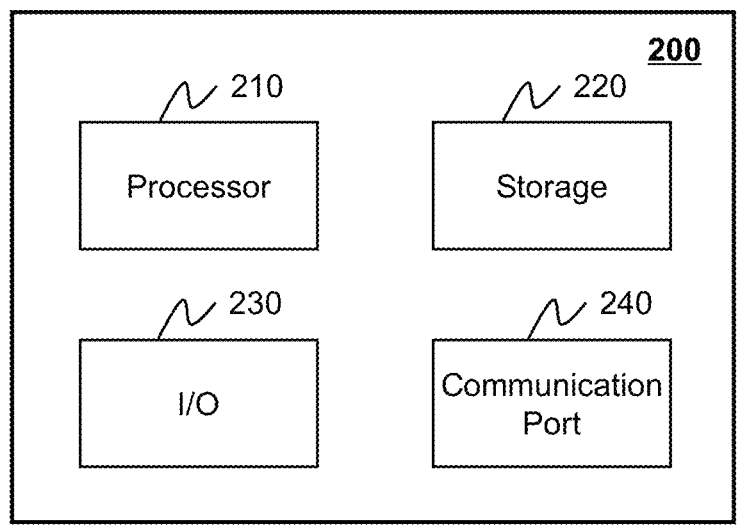
FIG. 2 is a schematic diagram illustrating exemplary hardware and/or software components of a computing device according to some embodiments of the present disclosure.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or themselves, and/or may be invoked in response to detected events or interrupts. Software modules/units/blocks configured for execution on computing devices (e.g., processor 210 as illustrated in FIG. 2) may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may apply to a system, a device, or a portion thereof.

It will be understood that when a unit, device, module, or block is referred to as being "on," "connected to," or "coupled to," another unit, device, module, or block, it may be directly on, connected or coupled to, or communicate with the other unit, device, module, or block, or an intervening unit, device, module, or block may be present, unless the context clearly indicates otherwise. As used herein, the term "and/or" includes any and all combinations of one or more of the associated listed items. The term "pixel" and "voxel" in the present disclosure are used interchangeably to refer to an element in an image. The term "image" in the present disclosure is used to refer to images of various forms, including a 2-dimensional image, a 3-dimensional image, a 4-dimensional image, etc.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The flowcharts used in the present disclosure illustrate operations that systems implement according to some embodiments of the present disclosure. It is to be expressly understood the operations of the flowcharts may be implemented not in order. Conversely, the operations may be implemented in an inverted order, or simultaneously. Moreover, one or more other operations may be added to the flowcharts. One or more operations may be removed from the flowcharts.

Moreover, while the systems and methods disclosed in the present disclosure are described primarily regarding image reconstruction in an MRI system. It should be understood that this is only for illustration purposes. The systems and methods of the present disclosure may be applied to reconstruct image data acquired in different scenarios and/or for different purposes (e.g., safety monitoring, filming, or photography) and/or by different image devices (e.g., a computed tomography (CT) scanner, a positron emission tomography (PET) scanner).

For example, the systems and methods of the present disclosure may be applied to any other kind of medical imaging system. In some embodiments, the imaging system may include a single modality imaging system and/or a multi-modality imaging system. The single modality imaging system may include, for example, the MRI system. The multi-modality imaging system may include, for example, a computed tomography-magnetic resonance imaging (MRI-CT) system, a positron emission tomography-magnetic resonance imaging (PET-MRI) system, a single photon emission computed tomography-magnetic resonance imaging (SPECT-MRI) system, a digital subtraction angiography-magnetic resonance imaging (DSA-MRI) system, etc.

MRI systems are widely used in medical diagnosis and/or treatment by exploiting a powerful magnetic field and radio frequency (RF) techniques. Normally, full k-space data of a subject may need to be collected for reconstructing a full MRI image of the subject. In order to accelerate the data acquisition and reduce the scan time, a fraction of the full k-space data (i.e., a set of sub-sampled k-space data) may be acquired by sub-sampling technique with, for example, a reduced number of k-space sampling steps, a reduced number of samples per line, a reduced number of lines per blade, a reduced number of blades per acquisition, or the like, or any combination thereof. The sub-sampling technique may improve the efficiency of MRI scanning. However, it is difficult to reconstruct an accurate full image from a set of sub-sampled k-space data acquired in a sub-sampling scan because of the information loss during the sub-sampling scan, especially when a sub-sampling rate of the sub-sampling scan is high (e.g., higher than a threshold). Therefore, it is desired to provide systems and methods for reconstructing a full image with an improved image quality for a sub-sampling scan.

An aspect of the present disclosure provides systems and methods for MRI reconstruction. The systems may obtain a plurality of sub-sampled images of a subject. The plurality of sub-sampled images may include a first sub-sampled image of the subject and one or more second sub-sampled images of the subject. The first sub-sampled image may be generated using a first MRI sequence and a first sub-sampling rate. Each of the one or more second sub-sampled images may be generated using a second MRI sequence and a second sub-sampling rate. The second sub-sampling rate may be smaller than the first sub-sampling rate. The systems may also obtain an image reconstruction model having been trained according to a machine learning technique. Further, the systems may generate a first full image of the subject corresponding to the first MRI sequence based on the first sub-sampled image, the one or more second sub-sampled images using the image reconstruction model. Optionally, the systems may also obtain one or more reference full images of the subject each of which is generated using one of one or more third MRI sequences, and use the reference full image(s) in the generation of the first full image.

According to some embodiments of the present disclosure, the first sub-sampled image corresponding to the first sub-sampling rate may be reconstructed into the first full image based on one or more second sub-sampled images corresponding to the second sub-sampling rate(s) lower than the first sub-sampling rate and the reference full image(s) (optionally) of the subject using an image reconstruction model. The second sub-sampled image(s) may be acquired using lower sub-sampling rate(s) than the first MRI sequence, and have more image features and physiological information than the first sub-sampled image. Therefore, the second sub-sampled image(s) and the reference full image may provide reference information for assisting the image reconstruction model to generate the first full image. The reference information provided by the reference full image and the second sub-sampled image(s) may facilitate the information recovery in the reconstruction of the first full image, and improve the image quality and the reconstruction speed of the first full image. In this way, the total scan time of the subject may be reduced by adopting the sub-sampling imaging technique to acquire the first and second sub-sampled images instead of directly acquiring the first and second full images. Moreover, the reconstruction efficiency of the first full image may be improved because the application of the image reconstruction model may obviate the need of performing a calibration process between the first and second sub-sampled images.

In some embodiments, the image reconstruction model may include a first trained model and one or more second trained models. The first trained model may be configured to process the first sub-sampled image. Each of the second trained model(s) may be configured to process one of the second sub-sampled image(s). The first trained model and the one or more second trained models may be arranged according to their respective sub-sampling rates in ascending order and sequentially connected. During the application of the image reconstruction model, an input of the first trained model may include an output of each of the one or more second trained models. The output of each of the second trained model(s) may facilitate the first trained model to generate a first full image with an improved accuracy (e.g., having less artifacts and/or noises, and having more image features).

Figure 1:
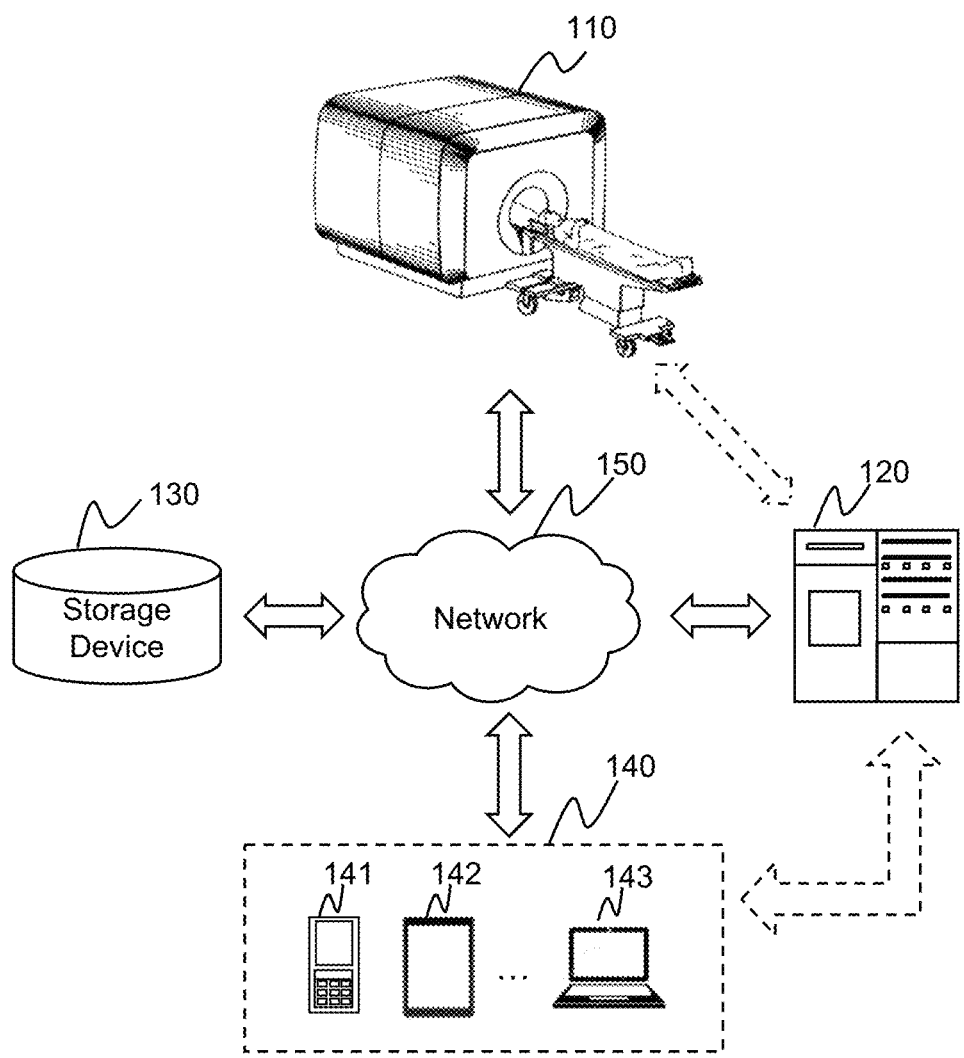
FIG. 1 is a schematic diagram illustrating an exemplary MRI system according to some embodiments of the present disclosure.

FIG. 1 is a schematic diagram illustrating an exemplary MRI system 100 according to some embodiments of the present disclosure. As shown in FIG. 1, the MRI system 100 may include an MRI scanner 110, a processing device 120, a storage device 130, one or more terminals 140, and a network 150. In some embodiments, the MRI scanner 110, the processing device 120, the storage device 130, and/or the terminal(s) 140 may be connected to and/or communicate with each other via a wireless connection, a wired connection, or a combination thereof. The connections between the components in the MRI system 100 may be variable. For example, the MRI scanner 110 may be connected to the processing device 120 through the network 150. As another example, the MRI scanner 110 may be connected to the processing device 120 directly.

The MRI scanner 110 may be configured to scan a subject (or a part of the subject) to acquire image data, such as MRI signals associated with the subject. For example, the MRI scanner 110 may detect a plurality of MRI signals by applying an MRI sequence on the subject. In some embodiments, the MRI scanner 110 may include, for example, a magnetic body, a gradient coil, an RF coil, etc. In some embodiments, the MRI scanner 110 may be a permanent magnet MRI scanner, a superconducting electromagnet MRI scanner, or a resistive electromagnet MRI scanner, etc., according to the types of the magnetic body. In some embodiments, the MRI scanner 110 may be a high-field MRI scanner, a mid-field MRI scanner, and a low-field MRI scanner, etc., according to the intensity of the magnetic field.

In the present disclosure, "subject" and "object" are used interchangeably. The subject may be biological or non-biological. For example, the subject may include a patient, a man-made subject, etc. As another example, the subject may include a specific portion, organ, tissue, and/or a physical point of the patient. For example, the subject may include head, brain, neck, body, shoulder, arm, thorax, cardiac, stomach, blood vessel, soft tissue, knee, feet, or the like, or a combination thereof.

In some embodiments, the processing device 120 may be a single server or a server group. The server group may be centralized or distributed. The processing device 120 may process data and/or information obtained from the MRI scanner 110, the storage device 130, and/or the terminal(s) 140. For example, the processing device 120 may obtain a plurality of sub-sampled images of a subject and an image reconstruction model having been trained according to a machine learning technique, and generate a full image of the subject based on the plurality of sub-sampled images and the image reconstruction model. As another example, the processing device 120 may obtain a plurality of training samples and a preliminary model, and generate the image reconstruction model by training the preliminary model based on the plurality of training samples.

In some embodiments, a trained model (e.g., the image reconstruction model) may be generated by a processing device, while the application of the trained model may be performed on a different processing device. In some embodiments, the trained model may be generated by a processing device of a system different from the MRI system 100 or a server different from the processing device 120 on which the application of the trained model is performed. For instance, the image reconstruction model may be generated by a first system of a vendor who provides and/or maintains such an image reconstruction model, while the generation of a full image based on the provided image reconstruction model may be performed on a second system of a client of the vendor. In some embodiments, the application of the trained model may be performed online in response to a request for generating a full image of a subject. In some embodiments, the trained model may be determined or generated offline.

In some embodiments, the trained model may be determined and/or updated (or maintained) by, e.g., the manufacturer of the MRI scanner 110 or a vendor. For instance, the manufacturer or the vendor may load the image reconstruction model into the MRI system 100 or a portion thereof (e.g., the processing device 120) before or during the installation of the MRI scanner 110 and/or the processing device 120, and maintain or update the image reconstruction model from time to time (periodically or not). The maintenance or update may be achieved by installing a program stored on a storage device (e.g., a compact disc, a USB drive, etc.) or retrieved from an external source (e.g., a server maintained by the manufacturer or vendor) via the network 150. The program may include a new model (e.g., a newly trained model) or a portion of a model that substitutes or supplement a corresponding portion of the model.

In some embodiments, the processing device 120 may be local or remote from the MRI system 100. For example, the processing device 120 may access information and/or data from the MRI scanner 110, the storage device 130, and/or the terminal(s) 140 via the network 150. As another example, the processing device 120 may be directly connected to the MRI scanner 110, the terminal(s) 140, and/or the storage device 130 to access information and/or data. In some embodiments, the processing device 120 may be implemented on a cloud platform. For example, the cloud platform may include a private cloud, a public cloud, a hybrid cloud, a community cloud, a distributed cloud, an inter-cloud, a multi-cloud, or the like, or a combination thereof. In some embodiments, the processing device 120 may be implemented by a computing device 200 having one or more components as described in connection with FIG. 2.

The storage device 130 may store data, instructions, and/or any other information. In some embodiments, the storage device 130 may store data obtained from the MRI scanner 110, the processing device 120, and/or the terminal(s) 140. In some embodiments, the storage device 130 may store data and/or instructions that the processing device 120 may execute or use to perform exemplary methods described in the present disclosure. In some embodiments, the storage device 130 may include a mass storage device, a removable storage device, a volatile read-and-write memory, a read-only memory (ROM), or the like, or a combination thereof. Exemplary mass storage devices may include a magnetic disk, an optical disk, a solid-state drive, etc. Exemplary removable storage devices may include a flash drive, a floppy disk, an optical disk, a memory card, a zip disk, a magnetic tape, etc. Exemplary volatile read-and-write memory may include a random access memory (RAM). Exemplary RAM may include a dynamic RAM (DRAM), a double date rate synchronous dynamic RAM (DDR SDRAM), a static RAM (SRAM), a thyristor RAM (T-RAM), a zero-capacitor RAM (Z-RAM), etc. Exemplary ROM may include a mask ROM (MROM), a programmable ROM (PROM), an erasable programmable ROM (EPROM), an electrically erasable programmable ROM (EEPROM), a compact disk ROM (CD-ROM), a digital versatile disk ROM, etc. In some embodiments, the storage device 130 may be implemented on a cloud platform as described elsewhere in the disclosure.

In some embodiments, the storage device 130 may be connected to the network 150 to communicate with one or more other components in the MRI system 100 (e.g., the MRI scanner 110, the processing device 120, and/or the terminal(s) 140). One or more components of the MRI system 100 may access the data or instructions stored in the storage device 130 via the network 150. In some embodiments, the storage device 130 may be part of the processing device 120 or the terminal(s) 140.

The terminal(s) 140 may be configured to enable a user interaction between a user and the MRI system 100. For example, the terminal(s) 140 may receive an instruction to cause the MRI scanner 110 to scan the subject from the user. As another example, the terminal(s) 140 may receive a processing result (e.g., a reconstructed MRI image of a subject) from the processing device 120 and display the processing result to the user. In some embodiments, the terminal(s) 140 may be connected to and/or communicate with the MRI scanner 110, the processing device 120, and/or the storage device 130. In some embodiments, the terminal(s) 140 may include a mobile device 141, a tablet computer 142, a laptop computer 143, or the like, or a combination thereof. For example, the mobile device 141 may include a mobile phone, a personal digital assistant (PDA), a gaming device, a navigation device, a point of sale (POS) device, a laptop, a tablet computer, a desktop, or the like, or a combination thereof.

In some embodiments, the terminal(s) 140 may include an input device, an output device, etc. The input device may include alphanumeric and other keys that may be input via a keyboard, a touch screen (for example, with haptics or tactile feedback), a speech input, an eye tracking input, a brain monitoring system, or any other comparable input mechanism. The input information received through the input device may be transmitted to the processing device 120 via, for example, a bus, for further processing. Other types of the input device may include a cursor control device, such as a mouse, a trackball, or cursor direction keys, etc. The output device may include a display, a speaker, a printer, or the like, or a combination thereof. In some embodiments, the terminal(s) 140 may be part of the processing device 120 or the MRI scanner 110.

The network 150 may include any suitable network that can facilitate the exchange of information and/or data for the MRI system 100. In some embodiments, one or more components of the MRI system 100 (e.g., the MRI scanner 110, the processing device 120, the storage device 130, the terminal(s) 140, etc.) may communicate information and/or data with one or more other components of the MRI system 100 via the network 150. For example, the processing device 120 may obtain image data (e.g., MRI signals) from the MRI scanner 110 via the network 150. As another example, the processing device 120 may obtain user instructions from the terminal(s) 140 via the network 150.

The network 150 may include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network ("VPN"), a satellite network, a telephone network, routers, hubs, switches, server computers, or the like, or a combination thereof. For example, the network 150 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or a combination thereof. In some embodiments, the network 150 may include one or more network access points. For example, the network 150 may include wired and/or wireless network access points such as base stations and/or internet exchange points through which one or more components of the MRI system 100 may be connected to the network 150 to exchange data and/or information.

This description is intended to be illustrative, and not to limit the scope of the present disclosure. Many alternatives, modifications, and variations will be apparent to those skilled in the art. The features, structures, methods, and characteristics of the exemplary embodiments described herein may be combined in various ways to obtain additional and/or alternative exemplary embodiments. In some embodiments, the MRI system 100 may include one or more additional components and/or one or more components described above may be omitted. Additionally or alternatively, two or more components of the MRI system 100 may be integrated into a single component. For example, the processing device 120 may be integrated into the MRI scanner 110. As another example, a component of the MRI system 100 may be replaced by another component that can implement the functions of the component. In some embodiments, the storage device 130 may be a data storage including cloud-computing platforms, such as a public cloud, a private cloud, a community, and hybrid cloud, etc. However, those variations and modifications do not depart the scope of the present disclosure.

FIG. 2 is a schematic diagram illustrating exemplary hardware and/or software components of a computing device 200 according to some embodiments of the present disclosure. The computing device 200 may be used to implement any component of the MRI system 100 as described herein. For example, the processing device 120 and/or a terminal 140 may be implemented on the computing device 200, respectively, via its hardware, software program, firmware, or a combination thereof. Although only one such computing device is shown, for convenience, the computer functions relating to the MRI system 100 as described herein may be implemented in a distributed fashion on a number of similar platforms, to distribute the processing load. As illustrated in FIG. 2, the computing device 200 may include a processor 210, a storage device 220, an input/output (I/O) 230, and a communication port 240.

The processor 210 may execute computer instructions (e.g., program code) and perform functions of the processing device 120 in accordance with techniques described herein. The computer instructions may include, for example, routines, programs, objects, components, data structures, procedures, modules, and functions, which perform particular functions described herein. For example, the processor 210 may process image data of a subject obtained from the MRI scanner 110, the storage device 130, terminal(s) 140, and/or any other component of the MRI system 100. As another example, the processor 210 may generate a full MRI image of the subject based on the (processed) image data of the subject.

In some embodiments, the processor 210 may include one or more hardware processors, such as a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combination thereof.

Merely for illustration, only one processor is described in the computing device 200. However, it should be noted that the computing device 200 in the present disclosure may also include multiple processors. The operations and/or method steps that are performed by one processor as described in the present disclosure may also be jointly or separately performed by the multiple processors. For example, if in the present disclosure the processor of the computing device 200 executes both operation A and operation B, it should be understood that operation A and operation B may also be performed by two or more different processors jointly or separately in the computing device 200 (e.g., a first processor executes operation A and a second processor executes operation B, or the first and second processors jointly execute operations A and B).

The storage device 220 may store data/information obtained from the MRI scanner 110, the storage device 130, the terminal(s) 140, and/or any other component of the MRI system 100. In some embodiments, the storage device 220 may include a mass storage device, a removable storage device, a volatile read-and-write memory, a read-only memory (ROM), or the like, or a combination thereof. In some embodiments, the storage device 220 may store one or more programs and/or instructions to perform exemplary methods described in the present disclosure. For example, the storage device 220 may store a program for the processing device 120 to execute to generate a trained model (e.g., an image reconstruction model). As another example, the storage device 220 may store a program for the processing device 120 to execute to apply the trained model (e.g., the image reconstruction model) to generate a full image of a subject.

The I/O 230 may input and/or output signals, data, information, etc. In some embodiments, the I/O 230 may enable a user interaction with the processing device 120. In some embodiments, the I/O 230 may include an input device and an output device. The input device may include alphanumeric and other keys that may be input via a keyboard, a touch screen (for example, with haptics or tactile feedback), a speech input, an eye tracking input, a brain monitoring system, or any other comparable input mechanism. The input information received through the input device may be transmitted to another component (e.g., the processing device 120) via, for example, a bus, for further processing. Other types of the input device may include a cursor control device, such as a mouse, a trackball, or cursor direction keys, etc. The output device may include a display (e.g., a liquid crystal display (LCD), a light-emitting diode (LED)-based display, a flat panel display, a curved screen, a television device, a cathode ray tube (CRT), a touch screen), a speaker, a printer, or the like, or a combination thereof.

The communication port 240 may be connected to a network (e.g., the network 150) to facilitate data communications. The communication port 240 may establish connections between the processing device 120 and one or more components of the MRI system 100 (e.g., the MRI scanner 110, the storage device 130, and/or the terminal(s) 140). The connection may be a wired connection, a wireless connection, any other communication connection that can enable data transmission and/or reception, and/or a combination of these connections. The wired connection may include, for example, an electrical cable, an optical cable, a telephone wire, or the like, or a combination thereof. The wireless connection may include, for example, a Bluetooth™ link, a Wi-Fi™ link, a WiMax™ link, a WLAN link, a ZigBee link, a mobile network link (e.g., 3G, 4G, 5G, etc.), or the like, or a combination thereof. In some embodiments, the communication port 240 may be and/or include a standardized communication port, such as RS232, RS485, etc. In some embodiments, the communication port 240 may be a specially designed communication port. For example, the communication port 240 may be designed in accordance with the digital imaging and communications in medicine (DICOM) protocol.

Figure 3:
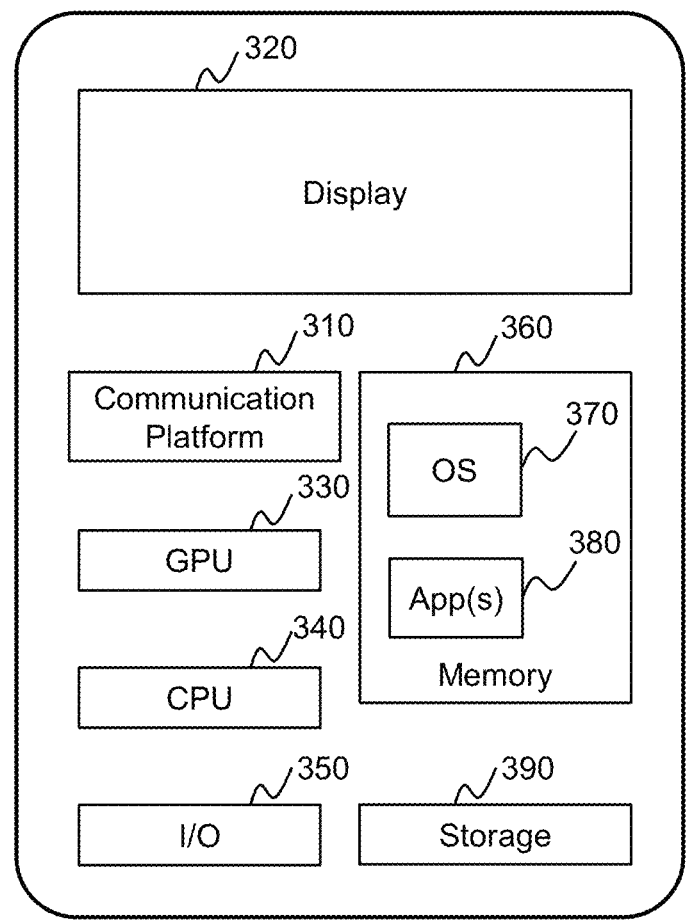
FIG. 3 is a schematic diagram illustrating exemplary hardware and/or software components of a mobile device according to some embodiments of the present disclosure.

FIG. 3 is a schematic diagram illustrating exemplary hardware and/or software components of a mobile device 300 according to some embodiments of the present disclosure. In some embodiments, one or more components of the MRI system 100 may be implemented on one or more components of the mobile device 300. Merely by way of example, a terminal 140 may be implemented on one or more components of the mobile device 300.

As illustrated in FIG. 3, the mobile device 300 may include a communication platform 310, a display 320, a graphics processing unit (GPU) 330, a central processing unit (CPU) 340, an I/O 350, a memory 360, and a storage 390. In some embodiments, any other suitable component, including but not limited to a system bus or a controller (not shown), may also be included in the mobile device 300. In some embodiments, a mobile operating system 370 (e.g., iOS™, Android™, Windows Phone™, etc.) and one or more applications 380 may be loaded into the memory 360 from the storage 390 in order to be executed by the CPU 340. The applications 380 may include a browser or any other suitable mobile apps for receiving and rendering information relating to the MRI system 100. User interactions with the information stream may be achieved via the I/O 350 and provided to the processing device 120 and/or other components of the MRI system 100 via the network 150.

To implement various modules, units, and their functionalities described in the present disclosure, computer hardware platforms may be used as the hardware platform(s) for one or more of the elements described herein. A computer with user interface elements may be used to implement a personal computer (PC) or any other type of work station or terminal device. A computer may also act as a server if appropriately programmed.

Figure 4A:
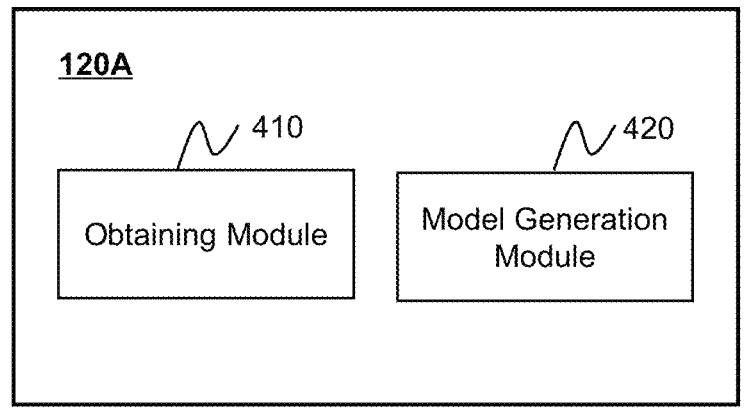
FIGS. 4A and 4B are block diagrams illustrating exemplary processing devices according to some embodiments of the present disclosure.
Figure 4B:
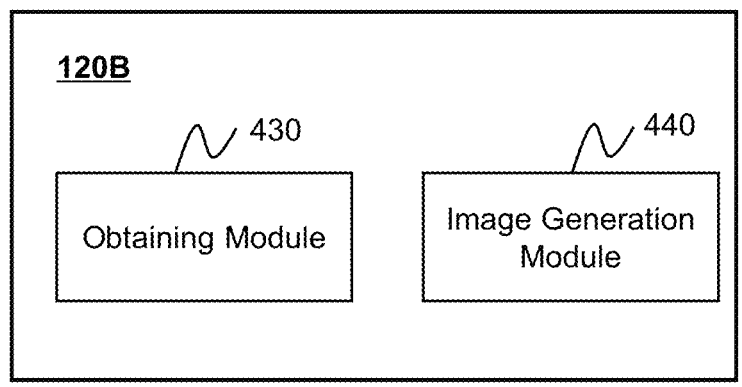

FIGS. 4A and 4B are block diagrams illustrating exemplary processing devices according to some embodiments of the present disclosure. The processing devices 120A and 120B may be exemplary embodiments of the processing device 120 as described in connection with FIG. 1. In some embodiments, the processing device 120A may be configured to generate an image reconstruction model. The processing device 120B may be configured to apply the image reconstruction model in generating a full image of a subject. In some embodiments, the processing devices 120A and 120B may be respectively implemented on a processing unit (e.g., a processor 210 illustrated in FIG. 2 or a CPU 340 as illustrated in FIG. 3). Merely by way of example, the processing devices 120A may be implemented on the computing device 200, and the processing device 120B may be implemented on a CPU 340 of a terminal device. Alternatively, the processing devices 120A and 120B may be implemented on a same computing device 200 or a same CPU 340. For example, the processing devices 120A and 120B may be implemented on a same computing device 200.

As shown in FIG. 4A, the processing device 120A may include an obtaining module 410 and a model generation module 420.

The obtaining module 410 may be configured to obtain information for generating the image reconstruction model. For example, the obtaining module 410 may be configured to obtain a plurality of training samples each of which includes a first sample sub-sampled image and one or more second sample sub-sampled images of a sample subject. In some embodiments, each of the plurality of training samples may further include one or more sample reference full images of the corresponding sample subject. More descriptions regarding the obtaining of the plurality of training samples may be found elsewhere in the present disclosure. See, e.g., operation 810 in FIG. 8 and relevant descriptions thereof. As another example, the obtaining module 410 may be configured to obtain a preliminary model including a first model and one or more second models. The preliminary model refers to an algorithm or a model (e.g., a machine learning model) to be trained as the image reconstruction model. The first model refers to an algorithm or a model to be trained as the first trained model as described in connection with FIG. 5. The second model(s) refers to an algorithm or a model to be trained as the second trained model(s) as described in connection with FIG. 5. More descriptions regarding the obtaining of the preliminary model may be found elsewhere in the present disclosure. See, e.g., operation 820 in FIG. 8 and relevant descriptions thereof.

The model generation module 420 may be configured to generate the one or more second trained models by training the one or more second models based on the one or more second sample sub-sampled images of each of the plurality of training samples. More descriptions regarding the generation of the one or more second trained models may be found elsewhere in the present disclosure. See, e.g., operation 830 in FIG. 8 and relevant descriptions thereof. The model generation module 420 may be further configured to generate the first trained model by training the first model based on the first sample sub-sampled image of each of the plurality of first training samples and the one or more second trained models. More descriptions regarding the generation of the first trained model may be found elsewhere in the present disclosure. See, e.g., operation 840 in FIG. 8 and relevant descriptions thereof.

As shown in FIG. 4B, the processing device 120B may include an obtaining module 430 and an image generation module 440.

The obtaining module 430 may be configured to obtain information for generating a full image of a subject. For example, the obtaining module 430 may be configured to obtain a plurality of sub-sampled images of the subject. The plurality of sub-sampled images of the subject obtained in 510 may include a first sub-sampled image of the subject and one or more second sub-sampled images of the subject. The first sub-sampled image may be generated using a first MRI sequence and a first sub-sampling rate, and the one or more second sub-sampled images may be generated using one or more second MRI sequences and one or more second sub-sampling rates. Each of the second sub-sampled image(s) may be generated using one of the second MRI sequence(s) and one of the second sub-sampling rate(s). In some embodiments, the obtaining module 430 may be configured to obtain one or more reference full images of the subject. More descriptions regarding the obtaining of the plurality of sub-sampled images of the subject may be found elsewhere in the present disclosure. See, e.g., operation 510 in FIG. 5 and relevant descriptions thereof.

As another example, the obtaining module 430 may be configured to obtain the image reconstruction model. More descriptions regarding the obtaining of the image reconstruction model may be found elsewhere in the present disclosure. See, e.g., operation 520 in FIG. 5 and relevant descriptions thereof.

The image generation module 440 may be configured to generate a first full image of the subject corresponding to the first MRI sequence. For example, for each of the second sub-sampled image(s), the image generation module 440 may be configured to generate a second full image by processing the second sub-sampled image using its corresponding second trained model. More descriptions regarding the generation of the second full image of the subject may be found elsewhere in the present disclosure. See, e.g., operation 610 in FIG. 6 and relevant descriptions thereof. The image generation module 440 may be further configured to generate the first full image by processing the second full image(s) and the first sub-sampled image using the first trained model. More descriptions regarding the generation of the first full image of the subject may be found elsewhere in the present disclosure. See, e.g., operation 620 in FIG. 6 and relevant descriptions thereof.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the processing device 120A and/or the processing device 120B may share two or more of the modules, and any one of the modules may be divided into two or more units. For instance, the processing devices 120A and 120B may share a same obtaining module; that is, the obtaining module 410 and the obtaining module 430 are a same module. In some embodiments, the processing device 120A and/or the processing device 120B may include one or more additional modules, such as a storage module (not shown) for storing data. In some embodiments, the processing device 120A and the processing device 120B may be integrated into one processing device 120.

FIG. 5 is a flowchart illustrating an exemplary process for generating a first full image of a subject according to some embodiment of the present disclosure. In some embodiments, process 500 may be executed by the MRI system 100. For example, the process 500 may be implemented as a set of instructions (e.g., an application) stored in a storage device (e.g., the storage device 130, the storage device 220, and/or the storage 390). In some embodiments, the processing device 120B (e.g., the processor 210 of the computing device 200, the CPU 340 of the mobile device 300, and/or one or more modules illustrated in FIG. 4B) may execute the set of instructions and may accordingly be directed to perform the process 500.

In 510, the processing device 120B (e.g., the obtaining module 430) may obtain a plurality of sub-sampled images of the subject.

As used herein, the subject may include a biological subject and/or a non-biological subject, such as a patient or a specific portion (e.g., an organ or a tissue) of the patient, an animal, or the like. Merely by way of example, the subject may include at least a portion of an organ (e.g., the brain, the lungs, the liver) or a tissue of a patient.

A sub-sampled image may be a 2D image (e.g., a slice image) or a 3D image. In some embodiments, the sub-sampled image of the subject may be acquired by performing an MRI scan on the subject using a sub-sampling technique (or referred to as a sub-sampling scan). Normally, full k-space data MRI may need to be collected for reconstructing a full MRI image of the subject. In order to accelerate the data acquisition and reduce the scan time, a fraction of the full k-space data (i.e., a set of sub-sampled k-space data) may be acquired by the sub-sampling technique with, for example, a reduced number of k-space sample steps, a reduced number of samples per line, a reduced number of lines per blade, a reduced number of blades per acquisition, or the like, or any combination thereof. It can be understood that image features and physiological information included in a sub-sampled image acquired by performing a sub-sampling scan may be less than that included in a full image acquired by performing a full-sampling scan. As used herein, a sub-sampling scan refers to an MRI scan performed using the sub-sampling technique, and a full-sampling scan refers to an MRI scan performed without using the sub-sampling technique.

In some embodiments, the sub-sampling scan may be performed by an MRI scanner (e.g., the MRI scanner 110) based on an MRI sequence and a sub-sampling rate. The MRI sequence may be defined by one or more scan parameters, such as the type of the MRI pulse sequence, a time for applying the MRI pulse sequence, a duration of the MRI pulse sequence, a flip angle of an RF pulse in the MRI pulse sequence, a count (or number) of RF pulses in the MRI pulse sequence, a unit repetition time (TR), a repetition count, an inversion time (TI), a gradient, a signal acquisition time, or the like, or any combination thereof. The type of the MRI sequence may include a spin-echo (SE) sequence, a fast spin-echo (FSE) sequence, a gradient-echo (GRE) sequence, a fast gradient-echo (FGRE) sequence, a steady-state free precession (SSFP) sequence, an inversion recovery (IR) sequence, an echo-planar imaging (EPI) sequence, or the like, or a combination thereof. The IR sequence may include a short time inversion recovery (STIR) sequence and a fluid-attenuated inversion recovery (FLAIR) sequence. Different MRI sequences have different values of the scan parameters. For example, by setting different TEs and repetition times, a spin-echo sequence may be classified into different types, such as a T1W1 sequence, a T2W1 sequence, a PDW1 sequence, or the like. A T1-weighted image may be obtained using the T1W1 sequence, a T2-weighted image may be obtained using the T2W1 sequence, and a proton-weighted image may be obtained using the PDW1 sequence.

The sub-sampling rate may be measured by, for example, a ratio of the data volume of full K-space data to that of sub-sampled K-space data acquired in the sub-sampling scan. For example, assuming that the value of the sub-sampling rate corresponding to a full-sampling scan is 1, the value of the sub-sampling rate corresponding to the sub-sampling scan may be greater than 1, such as 2, 2.25, 3.5, or the like. A larger sub-sampling rate may result in a set of sub-sampled k-space data having fewer image features and less physiological information, and a resulting sub-sampled image having a lower image quality (e.g., more artifacts).

In some embodiments, the processing device 120B may generate the sub-sampled image by mapping the corresponding set of sub-sampled K-space data (or the original sub-sampled MRI signals collected in the sub-sampling scan) into the image domain using at least one operation, such as an inverse Fourier transformation. Alternatively, the sub-sampled image may be previously generated by a computing device (e.g., the processing device 120B) and stored in a storage device (e.g., the storage device 130, the storage device 220, the storage 390, or an external storage device). The processing device 120B may retrieve the sub-sampled image from the storage device.

In some embodiments, the plurality of sub-sampled images of the subject obtained in 510 may include a first sub-sampled image of the subject and one or more second sub-sampled images of the subject. The first sub-sampled image may be generated using a first MRI sequence and a first sub-sampling rate, and the one or more second sub-sampled images may be generated using one or more second MRI sequences and one or more second sub-sampling rates. Each of the second sub-sampled image(s) may be generated using one of the second MRI sequence(s) and one of the second sub-sampling rate(s).

In some embodiments, each of the second sub-sampling rate(s) may be smaller than the first sub-sampling rate. For example, the one or more second sub-sampling rates may be 1.5, 2, and 2.25, and the value of the first sub-sampling rate may be 3.5. As described above, a larger sub-sampling rate may result in a set of sub-sampled k-space data having fewer image features and less physiological information, and a sub-sampled image having a lower image quality. In such cases, each second sub-sampled image may have better image quality and more physiological information than the first sub-sampled image.

In some embodiments, the second sub-sampling rates corresponding to different second sub-sampled images may be the same or different. The first MRI sequence and a second MRI sequence may be of the same type or different types. The second MRI sequences corresponding to different second sub-sampled images may be of the same type or different types. For example, the first MRI sequence and the second MRI sequence(s) may both be a T1W1 MRI sequence. As another example, the first MRI sequence may be a T1W1 MRI sequence, the second MRI sequence(s) may be a T2W1 MRI sequence and a PDW1 MRI sequence. In some embodiments, if the second MRI sequences corresponding to different second sub-sampled images are of the same type, the second sub-sampling rates corresponding to the different second sub-sampled images may be different. For example, if two second sub-sampled images are both generated using a T1W1 sequence, the two second sub-sampled images may be acquired using different second sub-sampling rates.

In some embodiments, the processing device 120B (e.g., the obtaining module 430) may further obtain one or more reference full images of the subject. Each of the reference full image(s) may be generated using one of one or more third MRI sequences. A third MRI sequence may be of a same type as or a different type from the first MRI sequence or a second MRI sequence. For example, the third MRI sequence and the first MRI sequence may both be a SE MRI sequence. As another example, the third MRI sequence may be a T1W1 MRI sequence, the first MRI sequence may be a GRE MRI sequence, and the second MRI sequence(s) may be a PDW1 MRI sequence.

In some embodiments, the first MRI sequence, the second MRI sequence(s), and the third MRI sequence(s) may be of different types. Additionally or alternatively, the second sub-sampling rates of different second MRI sequences may be different. Merely by way of example, a third MRI sequence is a SE MRI sequence, the first MRI sequence is a GRE MRI sequence corresponding to a first sub-sampling rate of 3, and a second MRI sequence is a FLAIR MRI sequence corresponding to a second sub-sampling rate of 2. As another example, a third MRI sequence is a T2W1 MRI sequence, the first MRI sequence is a GRE MRI sequence corresponding to a first sub-sampling rate of 3, a second MRI sequence is a T1W1 MRI sequence corresponding to a second sub-sampling rate of 2, and another second MRI sequence is a PDW1 MRI sequence corresponding to a second sub-sampling rate of 2.25.

In some embodiments, the count of the third MRI sequence(s) may be denoted as n, and the total count of the first and second MRI sequences may be denoted as m. Because a sub-sampling scan normally has a shorter sampling time and a higher imaging speed than a full-sampling scan, the total count of the first and second MRI sequences may be greater than the count of the third MRI sequence(s), that is, m>n. Merely by way of example, n is 1 and m is 3. This may reduce the scan time of the subject and improve the scanning efficiency.

In some embodiments, the processing device 120B may obtain the first sub-sampled image, the second sub-sampled image(s), and the reference full image(s) from an MRI scanner in real-time or a storage device (e.g., the storage device 130, the storage device 220, and/or the storage 390). Merely by way of example, a combined MRI scan may be performed on the subject by the MRI scanner based on at least one MRI sequence and at least one sub-sampling rate. The combined MRI scan may include a full-sampling scan performed according to a T2WI MRI sequence. Full k-space data of the subject may be generated by filling MRI signals collected in the full-sampling scan into K-space (e.g., by performing phase encoding and/or frequency encoding), and a reference full image of the subject may be generated based on the full k-space data. The combined MRI scan may further include a sub-sampling scan S1 performed according to a T1W1 MRI sequence and a sub-sampling rate of 2, a sub-sampling scan S2 performed according to a PDW1 MRI sequence and a sub-sampling rate of 2.25, and a sub-sampling scan S3 performed according to a GRE MRI sequence and a sub-sampling rate of 3. MRI signals collected in each of the sub-sampling scans S1, S2, and S3 may be filled into k-space to generate a corresponding set of sub-sampled k-space data of the subject, which may be used to generate a corresponding sub-sampled image of the subject. The reference full image and three sub-sampled images may be sent to a computing device (e.g., the processing device 1206) for further processing, or a storage device (e.g., the storage device 130, the storage device 220, and/or the storage 390) for storing. Among the three sub-sampled images, the sub-sampled image acquired by the sub-sampling scan S3 with the highest sub-sampling rate may be regarded as a first sub-sampled image, and the other two sub-sampled images may be regarded as two second sub-sampled images.

In some embodiments, a sub-sampling scan may be performed by an MRI scanner including a plurality of coil units. A sub-sampled image (e.g., the first sub-sampled image, a second sub-sampled image) acquired by the sub-sampling scan may be generated based on data acquired by one or more of the plurality of coil units. For example, a coil image of each coil unit may be generated based on MRI data collected by the coil unit, and the sub-sampled image may be generated by combining the coil images of the coil units. As another example, the sub-sampled image may be generated based on MRI data collected by a single coil unit of the coil units.

In 520, the processing device 120B (e.g., the obtaining module 430) may obtain an image reconstruction model.

An image reconstruction model refers to a model (e.g., a machine learning model) or an algorithm for MRI image reconstruction. For example, the image reconstruction model may be configured to reconstruct a sub-sampled image (or sub-sampled k-space data) into a predicted full image. In some embodiments, the image reconstruction model may be of a machine learning model, such as a neural network model. For example, the image reconstruction model may include a Fully Convolutional Network (FCN) model, a V-net model, a U-net model, an Alex network (AlexNet) model, a ResUNet model, a VB-net model, a Visual Geometry Group network (VGGNet) model, or the like, or any combination thereof.

In some embodiments, the image reconstruction model may be obtained from one or more components of the MRI system 100 or an external source via a network (e.g., the network 150). For example, the image reconstruction model may be previously trained by a computing device (e.g., the processing device 120A), and stored in a storage device (e.g., the storage device 130, the storage device 220, and/or the storage 390) of the MRI system 100. The processing device 120B may access the storage device and retrieve the image reconstruction model.

In some embodiments, the image reconstruction model may have been trained according to a machine learning technique. Exemplary machine learning techniques may include an artificial neural network algorithm, a deep learning algorithm, a decision tree algorithm, an association rule algorithm, an inductive logic programming algorithm, a support vector machine algorithm, a clustering algorithm, a Bayesian network algorithm, a reinforcement learning algorithm, a representation learning algorithm, a similarity and metric learning algorithm, a sparse dictionary learning algorithm, a genetic algorithm, a rule-based machine learning algorithm, or the like, or any combination thereof. The machine learning technique used to train the Image reconstruction model may be a supervised learning algorithm, a semi-supervised learning algorithm, an unsupervised learning algorithm, or the like. In some embodiments, the image reconstruction model may be trained by a computing device (e.g., the processing device 120A) by performing a process (e.g., process 800) for training an image reconstruction model disclosed herein. More descriptions regarding the training of the image reconstruction model may be found elsewhere in the present disclosure. See, e.g., FIG. 8 and relevant descriptions thereof.

In some embodiments, the image reconstruction model may include a first trained model and one or more second trained models. The first trained model may be configured to process the first sub-sampled image. Each of the second trained model(s) may be configured to process one of the second sub-sampled image(s). The first trained model and the one or more second trained models may be of a same type or different types.

As described above, the first sub-sampled image may be generated using the first MRI sequence and the first sub-sampling rate, and each second sub-sampled image may be generated using a second MRI sequence and a second sub-sampling rate. In some embodiments, the first trained model used to process the first sub-sampled image may correspond to the first MRI sequence and the first sub-sampling rate. Additionally or alternatively, a second trained model used to process a specific second sub-sampled image may correspond to the second MRI sequence and the second sub-sampling rate of the specific second sub-sampled image. As used herein, if a trained model is trained based on a plurality of sample sub-sampled images generated using a specific MRI sequence and a specific sub-sampling rate, the trained model may be deemed as being corresponding to the specific MRI sequence and the specific sub-sampling rate. Merely by way of example, a trained model corresponding to a T1W1 MRI sequence and a sub-sampling rate of 2 may be trained using a plurality of sample sub-sampled images generated using the T1WI MRI sequence with the sub-sampling rate of 2, and the trained model may be applied to process a sub-sampled image acquired using the T1WI MRI sequence with the sub-sampling rate of 2. In some embodiments, the count of the trained models included of the image reconstruction model may be the same as that of the MRI sequences or the sub-sampling rates corresponding to the sub-sampled images.

In some embodiments, the first trained model may correspond to an MRI sequence other than the first MRI sequence and/or a sub-sampling rate other than the first sub-sampling rate. Additionally or alternatively, a second trained model used to process a specific second sub-sampled image may correspond to an MRI sequence other than the second MRI sequence and/or a sub-sampling rate other than the second sub-sampling rate.

In some embodiments, the first trained model and the one or more second trained models may be arranged according to their respective sub-sampling rates in ascending order and sequentially connected. Optionally, during the application of the image reconstruction model, an input of the first trained model may include an output of each of the one or more second trained models. For example, a first trained model M1 may correspond to a first sub-sampling rate of 3, a second trained model M2 may correspond to a second sub-sampling rate of 2, and a second trained model M3 may correspond to a second sub-sampling rate of 2.25. The first trained model M1, the second trained model M2, and the second trained model M3 may be arranged in the order of M2-M3-M1. An input of the second trained model M3 may include an output of the second trained model M2. An input of the first trained model M1 may include the output of the second trained model M2 and an output of the second trained model M3. More descriptions regarding the image reconstruction model may be found elsewhere in the present disclosure. See, e.g., FIG. 7 and relevant descriptions thereof. In some embodiments, a model including a plurality of sequentially connected sub-models may also be referred to as a cascade model.

In 530, the processing device 120B (e.g., the image generation module 440) may generate a first full image of the subject corresponding to the first MRI sequence.

The first full image may be a predicted full image corresponding to the first MRI sequence reconstructed using the image reconstruction model. In the reconstruction process of the first full image, the image reconstruction model may recover image features of the first sub-sampled image that are lost during the corresponding sub-sampling scan. The first full image of the subject may be close to an image of the subject acquired by performing a full-sampling scan based on the first MRI sequence. In some embodiments, the processing device 120B may generate the first full image of the subject based on the first sub-sampled image, the second sub-sampled image(s), and the reference full image(s) using the image reconstruction model.

In some embodiments, operation 530 may be performed by process 600 as shown in FIG. 6.

In 610, for each of the second sub-sampled image(s), the processing device 1206 (e.g., the image generation module 440) may generate a second full image by processing the second sub-sampled image using its corresponding second trained model.

For a second sub-sampled image generated using a second MRI sequence, its second full image may be a predicted full image corresponding to the second MRI sequence reconstructed using the corresponding second trained model. In the reconstruction process of the second full image, the corresponding second trained model may recover image features of the second sub-sampled image that are lost during the corresponding sub-sampling scan. The second full image of the subject may be close to an image of the subject acquired by performing a full-sampling scan based on the corresponding second MRI sequence.

In some embodiments, the second sub-sampled image(s) may include a plurality of second sub-sampled images corresponding to a plurality of second sub-sampling rates. The processing device 120B may generate a ranking result by ranking the plurality of second sub-sampled images according to their respective second sub-sampling rates in, for example, ascending order. The processing device 120B may then sequentially process the plurality of second sub-sampled images in the ranking result to generate a plurality of second full images. For example, the second sub-sampled images in the ranking result may be sequentially processed by their respective corresponding second trained models.

In 620, the processing device 120B (e.g., the image generation module 440) may generate the first full image by processing the second full image(s) and the first sub-sampled image using the first trained model.

For example, the processing device 120B may input the second full image(s) and the first sub-sampled image into the first trained model, and the first trained model may output the first full image. In some embodiments, the reference full image(s) as described in connection with operation 510 may also be inputted into the first trained model.

Figure 7:
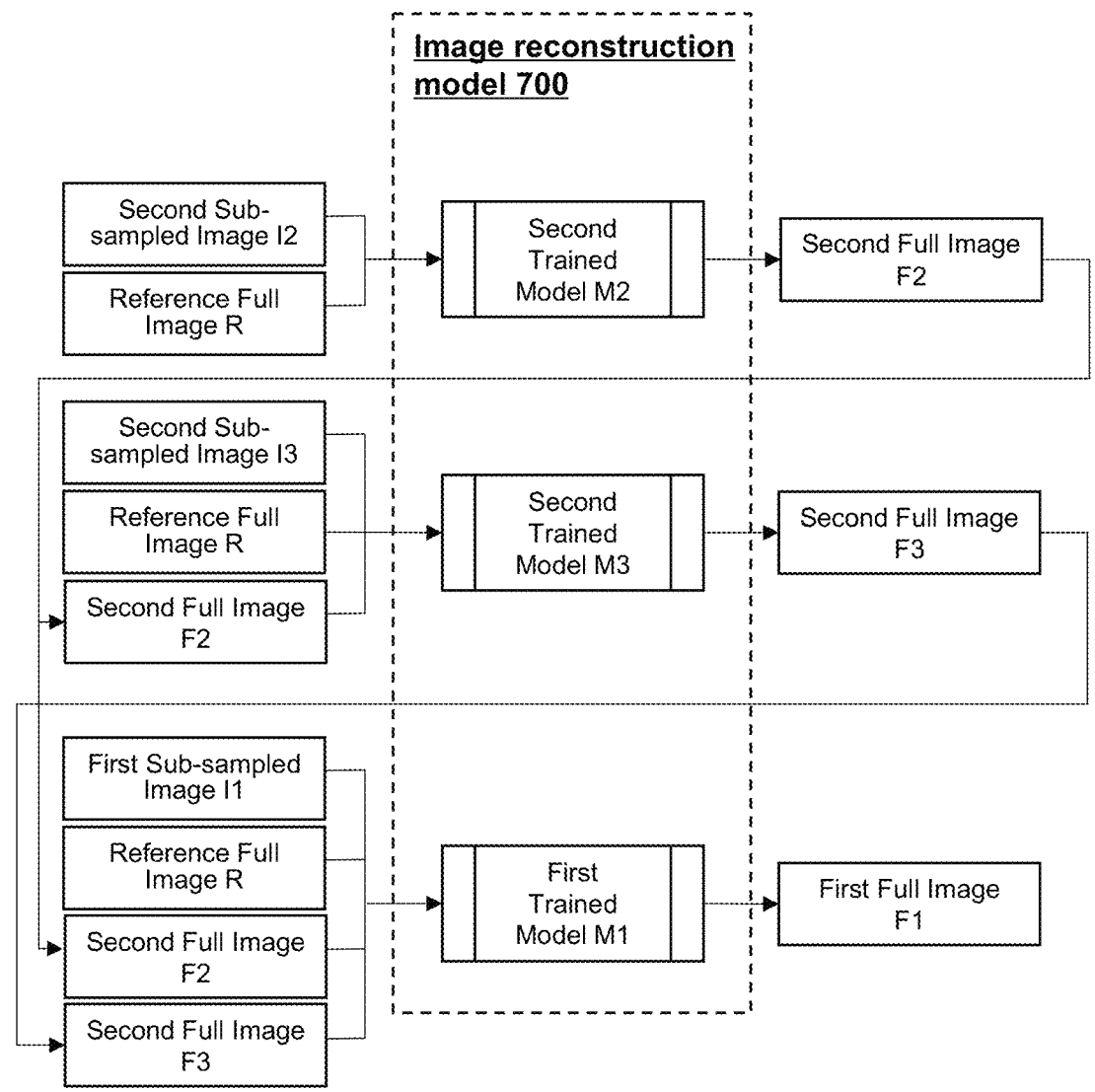
FIG. 7 is a schematic diagram illustrating an exemplary process for generating a first full image of a subject according to some embodiments of the present disclosure.

For illustration purposes, FIG. 7 provides an exemplary schematic diagram showing a process for generating a first full image F1 according to some embodiments of the present disclosure. As shown in FIG. 7, the first full image F1 may be generated based on a first sub-sampled image 11, a second sub-sampled image 12, a second sub-sampled image 13, and a reference full image R using an image reconstruction model 700. The first sub-sampled image 11 may be generated using a first MRI sequence Q1 and a first sub-sampling rate of 3. The second sub-sampled image 12 may be generated using a second MRI sequence Q2a and a second sub-sampling rate of 2. The second sub-sampled image 13 may be generated using a second MRI sequence Q2b and a second sub-sampling rate of 2.25. The reference full image R may be generated using a third MRI sequence QR.

The image reconstruction model may include a first trained model M1, a second trained model M2, and a second trained model M3. The first trained model M1 may be configured to process the first sub-sampled image 11, the second trained model M2 may be configured to process the second sub-sampled image 12, and the second trained model M3 may be configured to process the second sub-sampled image 13. In some embodiments, the first trained model M1 may correspond to the first MRI sequence Q1 and the first sub-sampling rate of 3; the second trained model M2 may correspond to the second MRI sequence Q2a and the second sub-sampling rate of 2; and the second trained model M3 may correspond to the second MRI sequence Q2b and the second sub-sampling rate of 2.25. In the image reconstruction model 700, the first trained model M1, the second trained model M2, and the second trained model M3 may be ranked according to their respective sub-sampling rates in ascending order (i.e., in an order of M2-M3-M1) and sequentially connected.

To generate the first full image F1, the processing device 120B may first generate a second full image F2 corresponding to the second sub-sampled image 12 and a second full image F3 corresponding to the second sub-sampled image 13. For example, the second sub-sampled image 12 and the second sub-sampled image 13 may be ranked according to their respective second sub-sampling rates in ascending order. That is, the second sub-sampled image 12 may be ranked before the second sub-sampled image 13 and processed first.

As illustrated in FIG. 7, the processing device 120B may input the second sub-sampled image 12 and the reference full image R into the second trained model M2. The second trained model M2 may process its input and generate the second full image F2. The output of the second trained model M2 (i.e., the second full image F2) may serve as a portion of an input of the second trained model M3. The processing device 1206 may then input the second sub-sampled image 13, the second full image F2, and the reference full image R into the second trained model M3. The second trained model M3 may process its input and generate the second full image F3. The output of the second trained model M2 (i.e., the second full image F2) and the output of the second trained model M3 (i.e., the second full image F3) may serve as a portion of an input of the first trained model M1. The processing device 120B may further input the first sub-sampled image 11, the second full image F2, the second full image F3, and the reference full image R into the first trained model M1. The first trained model M1 may process its input and generate the first full image F1.

It should be noted that the example illustrated in FIG. 7 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

In some embodiments, the count of the trained models of the image reconstruction model 700 may be modified. Merely by way of example, the image reconstruction model 700 may include one or more additional trained models. For example, the image reconstruction model 700 may include a second trained model M4 corresponding to a lower sub-sampling rate than the second trained model M2. As another example, the image reconstruction model 700 may further include a third trained model corresponding to a higher sub-sampling rate than the first sub-sampling rate. In some embodiments, the reference full image R may be omitted. Alternatively, more than one reference full images may be used in the generation of the first full image F1. In some embodiments, the input of the first trained model M1 may be without the output of the second trained mode M2 (i.e., the second full image F2 may not be inputted into the first trained model M1).

According to some embodiments of the present disclosure, the first sub-sampled image corresponding to the first sub-sampling rate may be reconstructed into the first full image based on one or more second sub-sampled images corresponding to the second sub-sampling rate(s) lower than the first sub-sampling rate and the reference full image(s) (optionally) of the subject using an image reconstruction model. As described elsewhere in this disclosure, the second sub-sampled image(s) may have more image features and physiological information than the first sub-sampled image corresponding to a higher sub-sampling rate. Therefore, the second sub-sampled image(s) and the reference full image may provide reference information for assisting the image reconstruction model to generate the first full image. The reference information provided by the reference full image and the second sub-sampled image(s) may facilitate the information recovery in the reconstruction of the first full image and improve the image quality of the first full image.

In this way, the total scan time of the subject may be reduced by adopting the sub-sampling imaging technique to acquire the first and second sub-sampled images instead of directly acquiring the first and second full images. Moreover, the reconstruction efficiency of the first full image may be improved because the application of the image reconstruction model may obviate the need of performing a calibration process between the first and second sub-sampled images.

In some embodiments, if the second sub-sampled image(s) include a plurality of sub-sampled images, they may be ranked according to their respective second sub-sampling rates, and a second sub-sampled image corresponding to a lower second sub-sampling rate may be reconstructed into a second full image first. More reference information can be obtained if more second full images corresponding to the second sub-sampled images are generated. Based on the reference information, the image reconstruction model may be able to generate a first full image with an improved accuracy even if the first sub-sampled image is acquired using a high first sub-sampling rate (e.g., a first sub-sampling rate higher than a threshold). In this way, the total scan time in the MRI scanning process may be further reduced without compromising the imaging quality.

It should be noted that the above description regarding FIGS. 5-7 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, one or more operations may be added into a process or omitted from the process. Additionally or alternatively, two or more operations may be combined into a single operation, and/or an operation may be divided into two or more sub-operations. For example, operation 510 and operation 520 may be combined into a single operation. As another example, one or more other optional operations (e.g., a storing operation for storing a processing result or an intermediate processing result) may be added in the process 500.

Figure 8:
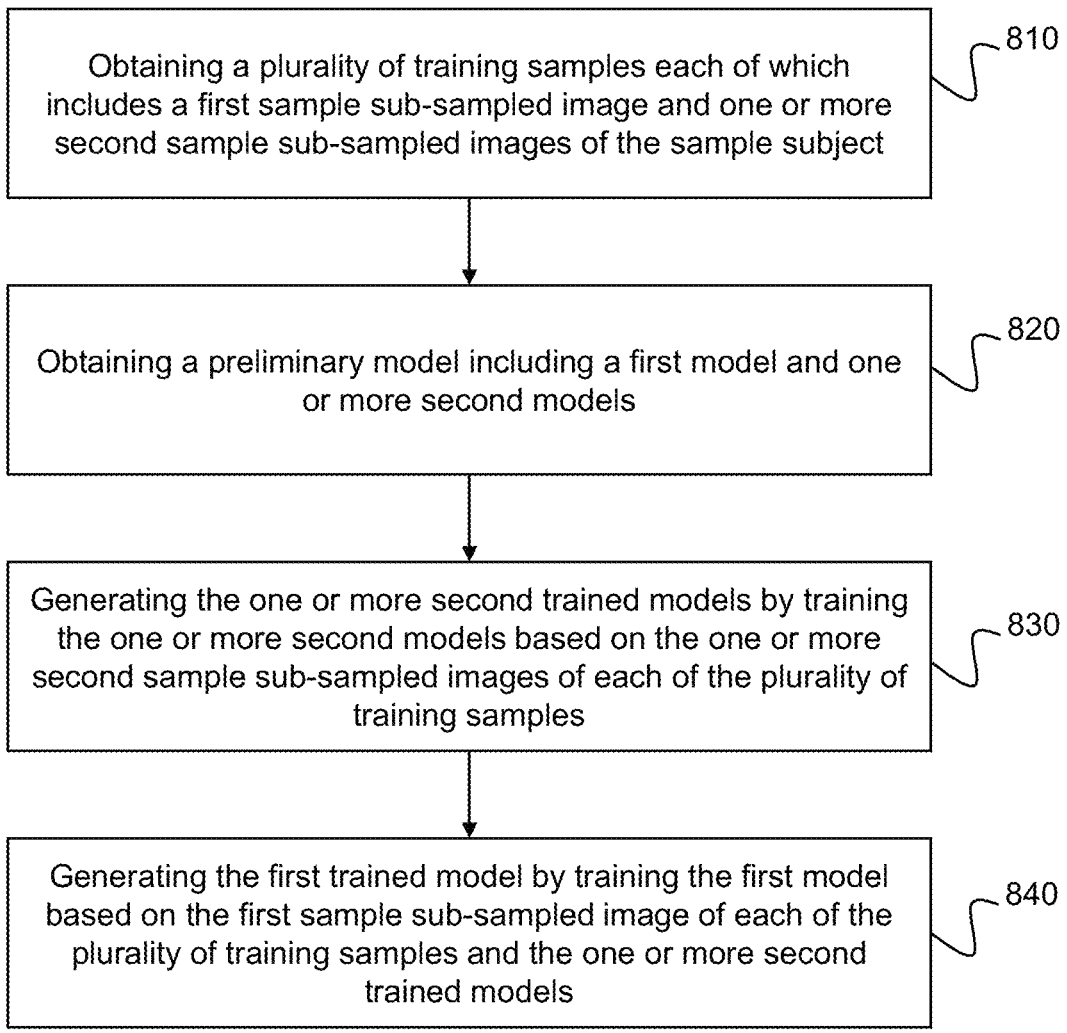

FIG. 8 is a flowchart illustrating an exemplary process for generating an image reconstruction model according to some embodiments of the present disclosure. In some embodiments, process 800 may be executed by the MRI system 100. For example, the process 800 may be implemented as a set of instructions (e.g., an application) stored in a storage device (e.g., the storage device 130, the storage device 220, and/or the storage 390). In some embodiments, the processing device 120A (e.g., the processor 210 of the computing device 200, the CPU 340 of the mobile device 300, and/or one or more modules illustrated in FIG. 4A) may execute the set of instructions and may accordingly be directed to perform the process 800.

In some embodiments, one or more operations of the process 800 may be performed to achieve at least part of operation 520 as described in connection with FIG. 5. In some embodiments, the process 800 may be performed by another device or system other than the MRI system 100, e.g., a device or system of a vendor of a manufacturer. For illustration purposes, the following descriptions are described with reference to the implementation of the process 800 by the processing device 120A, and not intended to limit the scope of the present disclosure.

In 810, the processing device 120A (e.g., the obtaining module 410) may obtain a plurality of training samples each of which includes a first sample sub-sampled image and one or more second sample sub-sampled images of a sample subject.

As used herein, a sample subject may include a biological subject and/or a non-biological subject, such as a patient or a specific portion (e.g., an organ or a tissue) of the patient. The sample subject and the subject as described in connection with 510 may be of the same type or different types. Two subjects may be deemed as being of the same type if they correspond to the same organ or tissue. In some embodiments, the sample subjects of different training samples may be of the same type or different types. For example, the sample subject of each training sample may be the heart of a patient.

A sample sub-sampled image of a sample subject refers to a sub-sampled image of the sample subject used as training data. The first sample sub-sampled image of a training sample may be generated based on the first MRI sequence and the first sub-sampling rate. Each second sample sub-sampled image of the training sample may be generated based on one of the second MRI sequence(s) and one of the second sub-sampling rate(s).

In some embodiments, the training sample may include a first image pair and one or more second image pairs. The first image pair may include a first ground truth full image and the first sample sub-sampled image of the sample subject of the training sample. The first ground truth full image may be generated by performing a full-sampling scan on the sample subject according to the first MRI sequence. The first sample sub-sampled image may be generated based on the first ground truth full image and the first sub-sampling rate. For example, a set of sub-sampled k-space data may be determined by performing a sub-sampling operation on full-sampled k-space data corresponding to the first ground truth full image, and the first sample sub-sampled image may be reconstructed from the set of sub-sampled k-space data. Each second image pair may include a second ground truth full image and a second sample sub-sampled image of the sample subject. For a second image pair, the second ground truth full image may be generated based on one of the one or more second MRI sequences, and the second sample sub-sampled image may be generated based on the second ground truth full image and one of the one or more second sub-sampling rates.

In some embodiments, each of the plurality of training samples may further include one or more sample reference full images of the corresponding sample subject. Each of the sample reference full image(s) may be generated based on one of the third MRI sequence(s). A sample reference full image of a sample subject may be similar to a reference full image of the subject as described in connection with operation 510.

Figure 9:
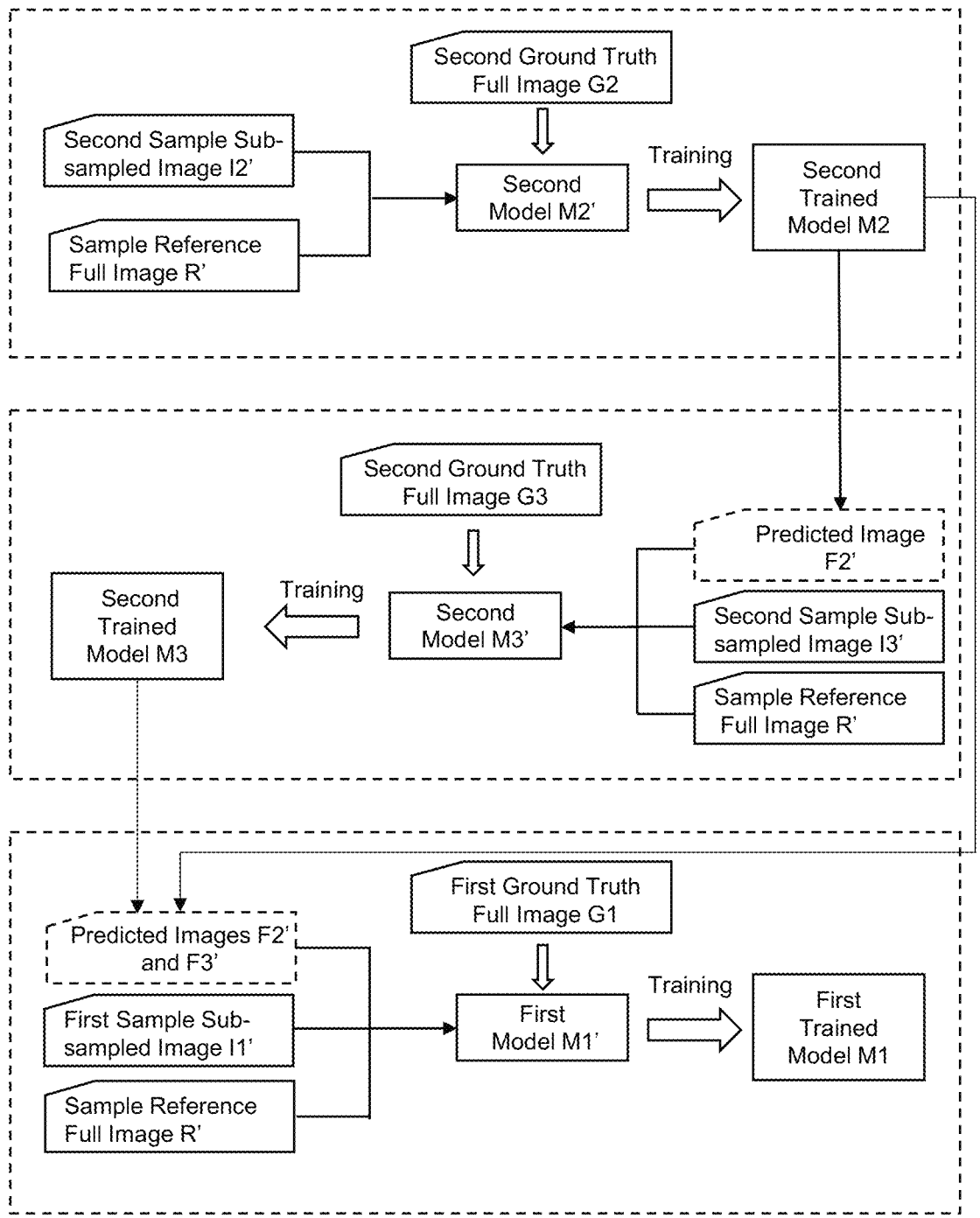
FIG. 9 is a schematic diagram illustrating an exemplary process for generating an image reconstruction model according to some embodiments of the present disclosure.

Merely by way of example, as shown in FIG. 9, a training sample of a sample subject may include a first sample sub-sampled image 11', a first ground truth full image G1, a second sample sub-sampled image 12', a second ground truth full image G2, a second sample sub-sampled image 13', a second ground truth full image G3, and a sample reference full image R'. The first ground truth full image G1 may be generated by performing a full-sampling scan on the sample subject according to the first MRI sequence Q1. The first sample sub-sampled image 11' may be generated based on the first ground truth full image G1 and the first sub-sampling rate of 3. The second ground truth full image G2 may be generated by performing a full-sampling scan on the sample subject according to the second MRI sequence Q2. The second sample sub-sampled image 12' may be generated based on the second ground truth full image G2 and the second sub-sampling rate of 2. The second ground truth full image G3 may be generated by performing a full-sampling scan on the sample subject according to the second MRI sequence Q3. The second sample sub-sampled image 13' may be generated based on the second ground truth full image G3 and the second sub-sampling rate of 2.25. The sample reference full image R' may be generated by performing a full-sampling scan on the sample subject according to a third MRI sequence QR.

In some embodiments, a training sample of a sample subject may be previously generated and stored in a storage device (e.g., the storage device 130, the storage device 220, and/or the storage 390). The processing device 120A may retrieve the training sample directly from the storage device. In some embodiments, at least a portion of the training sample may be generated by the processing device 120A. For example, the processing device 120A may obtain MRI signals of the sample subject detected during a full-sampling scan of the sample subject from the MRI scanner 110, wherein the full-sampling scan may be performed according to the first MRI sequence. The processing device 120A may further generate the first sample sub-sampled image and the first ground truth full image of the sample subject based on the MRI signals of the sample subject.

In 820, the processing device 120A (e.g., the obtaining module 410) may obtain a preliminary model including a first model and one or more second models.

The preliminary model refers to an algorithm or a model (e.g., a machine learning model) to be trained as the image reconstruction model. The first model refers to an algorithm or a model to be trained as the first trained model as described in connection with FIG. 5. The second model(s) refers to an algorithm or a model to be trained as the second trained model(s) as described in connection with FIG. 5.

For the convenience of descriptions, the first model and the second model(s) are referred to as a sub-model of the preliminary model. In some embodiments, a sub-model may include a machine learning model, such as a neural network model. For example, the sub-model may include a preliminary Fully Convolutional Network (FCN) model, a preliminary V-net model, a preliminary U-net model, a preliminary Alex network (AlexNet) model, a preliminary ResUNet model, a preliminary Visual Geometry Group network (VGGNet) model, or the like, or any combination thereof. In some embodiments, the preliminary model may be a preliminary cascade model in which the first model and the second model(s) are sequentially connected. In some embodiments, the count of the sub-models included in the preliminary model may be the same as that of the types of the first and second MRI sequences. Additionally or alternatively, the count of the sub-models included in the preliminary model may be the same as that of the types of the first and second sub-sampling rates.

In some embodiments, a sub-model of the preliminary model may include one or more model parameters. Exemplary model parameters of the sub-model may include the number (or count) of layers, the number (or count) of nodes, a loss function, or the like, or any combination thereof. Before training, the sub-model may have one or more initial parameter values of the model parameter(s). In the training of the sub-model, the value(s) of the model parameter(s) of the sub-model may be updated.

In some embodiments, the first model may be trained by the first sample sub-sampled images (or the first image pairs) of the training samples, which are generated based on the first MRI sequence and the first sub-sampling rate. Accordingly, the first trained model trained from the first model may correspond to the first MRI sequence and the first sub-sampling rate. The second sub-sampled images (or the second image pairs) generated by a same second MRI sequence and a same sub-sampling rate may form a training set corresponding to the second MRI sequence and the sub-sampling rate, which may be used to train one of the second model(s) to generate a second trained model corresponding to the second MRI sequence and the second sub-sampling rate. In some embodiments, a training set used to train a sub-model may include images acquired by different MRI sequences or different sub-sampling rates. For example, the first sample sub-sampled images (or the first image pairs) of the training samples may be acquired using the first MRI sequence and different sub-sampling rates, or the first sub-sampling rate and different MRI sequences. Accordingly, the first trained model trained from the first model may only correspond to one of the first MRI sequence and the first sub-sampling rate.

In some embodiments, the first model and the second model(s) may be sequentially trained according to their respective sub-sampling rates in ascending order. For example, a first model M1' may correspond to a sub-sampling rate of 3, a second model M2' may correspond to a sub-sampling rate of 2, and a second model M3' may correspond to a sub-sampling rate of 2.25. The first model M1', the second model M2', and the second model M3' may be trained in an order of M2'-M3'-M1'. In some embodiments, the training of a specific sub-model of the preliminary model may be performed based on one or more trained sub-models generated before the training of the specific sub-model. For example, the first model M1' may be trained based on the second trained models trained from the second models M2' and M3'. In some embodiments, the first model and the second model(s) may be trained jointly. For illustration purposes, the following descriptions are described with reference to a training process in which the first model and the second model(s) are trained sequentially, and not intended to limit the scope of the present disclosure.

In 830, the processing device 120A (e.g., the model generation module 420) may generate the one or more second trained models by training the one or more second models based on the one or more second sample sub-sampled images of each of the plurality of training samples.

In some embodiments, the one or more second models may be trained based on the one or more second sub-sampled images of each of the plurality of training samples using a machine learning algorithm as described elsewhere in this disclosure (e.g., FIG. 5 and the relevant descriptions). As aforementioned, a second model may be trained using a training set corresponding to a specific second MRI sequence and a specific second sub-sampling rate. In some embodiments, the second model may be trained further based on the one or more sample reference full images of the training sample. For example, referring to FIG. 9 again, the second model M2' may be trained first to generate the second trained model M2 using the second sample sub-sampled image 12', the second ground truth full image G2, and the sample reference full image R' of each training sample.

In some embodiments, the training of the second model M2' may include an iterative process including one or more iterations. For example, in a current iteration, an updated second model M2 generated in a previous iteration may be evaluated. For example, for each training sample, the processing device 120A may input the second sample sub-sampled image 12' and the sample reference full image R' of the training sample into the updated second model M2', and the updated second model M2' may generate an intermediate predicted full image corresponding to the second MRI sequence Q2. The processing device 120A may then determine a value of a first loss function by comparing the intermediate predicted full image with the second ground truth full image G2 corresponding to the second MRI sequence Q2 of each training sample.

The first loss function may be used to evaluate the accuracy and reliability of the updated second model M2', for example, if the updated second model M2' is not overfitting, the smaller the first loss function is, the more reliable the updated second model M2' is. Exemplary first loss functions may include an L1 loss function, a focal loss function, a log loss function, a cross-entropy loss function, a Dice loss function, etc. The processing device 120A may further update the value(s) of the model parameter(s) of the updated second model M2' to be used in a next iteration based on the value of the first loss function according to, for example, a backpropagation algorithm. In some embodiments, the one or more iterations may be terminated if a termination condition is satisfied in the current iteration. An exemplary termination condition may be that the value of the first loss function obtained in the current iteration is less than a predetermined threshold. Other exemplary termination conditions may include that a certain count of iterations is performed, that the first loss function converges such that the differences of the values of the first loss function obtained in consecutive iterations are within a threshold, etc. If the termination condition is satisfied in the current iteration, the processing device 120A may designate the updated second model M2' as the second trained model M2.

After the second trained model M2 is generated, the second model M3' may then be trained based on the second trained model M2. For example, for each training sample, the processing device 120A may input the second sample sub-sampled image 12' and the sample reference full image R' into the second trained model M2 to obtain a predicted image F2' (or referred to as a predicted full image F2') corresponding to the second MRI sequence Q2. The processing device 120A may then train the second model M3' using the predicted full image F2', the second sample sub-sampled image 13', the second ground truth full image G3, and the sample reference full image R' of each training sample. The training of the second model M3' may be performed in a similar manner as that of the second model M2'. For example, in an iteration for training the second model M3', an updated second model M3' may be evaluated. The processing device 120A may input the second sample sub-sampled image 13', the sample reference full image R', and the predicted image F2' into the updated second model M3', and the updated second model M3' may generate an intermediate predicted full image corresponding to the second MRI sequence Q3. The processing device 120A may then determine a value of a second loss function by comparing the intermediate predicted full image with the second ground truth full image G3 corresponding to the second MRI sequence Q3 of each training sample. The updated second model M3' may be evaluated based on the value of the second loss function in a similar manner as how the updated second model M2' is evaluated.

In 840, the processing device 120A (e.g., the model generation module 420) may generate the first trained model by training the first model based on the first sample sub-sampled image of each of the plurality of first training samples and the one or more second trained models.

For example, referring again to FIG. 9, the first model M1' may be trained based on the second trained model M2 and the second trained model M3. For example, for each training sample, the processing device 120A may input the predicted image F2', the second sample sub-sampled image 13', and the sample reference full image R' into the second trained model M3 to obtain a predicted image F3' corresponding to the second MRI sequence Q3. The processing device 120A may then train the first model M1' using the predicted full images F2' and F3', the first sample sub-sampled image 11', the first ground truth full image G1, and the sample reference full image R' of each training sample.

The training of the first model M1' may be performed in a similar manner as that of the second model M2' as described in operation 830. For example, in an iteration for training the first model M1', an updated first model M1' may be evaluated. The processing device 120A may input the predicted full images F2' and F3', the first sample sub-sampled image 11', and the sample reference full image R' into the updated first model M1', and the updated first model M1' may generate an intermediate predicted full image corresponding to the first MRI sequence Q1. The processing device 120A may then determine a value of a third loss function by comparing the intermediate predicted full image with the first ground truth full image G1 corresponding to the first MRI sequence Q1 of each training sample. The updated first model M1' may be evaluated based on the value of the third loss function in a similar manner as how the updated second model M2' is evaluated.

According to some embodiments of the present disclosure, in a training process, one or more predicted images corresponding to second MRI sequence(s) and one or more sample reference full images may be used in the training of the first model. The predicted image(s) and the sample reference full image(s) may provide reference information that can facilitate the training of the first model. For example, the reference information provided by the predicted image(s) and the sample reference full image may assist the first model to learn complex relationships (e.g., mapping relationships) between sample sub-sampled images corresponding to different sub-sampling rates, and learn an optimal mechanism to reconstruct an accurate first full image from a corresponding first sub-sampled image.

It should be noted that the above description regarding the process 800 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, one or more operations may be added or omitted. For example, the image reconstruction model may be stored in a storage device (e.g., the storage device 130) disclosed elsewhere in the present disclosure for further use. As another example, after the image reconstruction model is generated, the processing device 120A may further test the image reconstruction model using a set of testing samples. As a further example, the processing device 120A may update the image reconstruction model periodically or irregularly based on one or more newly-generated training samples (e.g., new first sample sub-sampled images and new second sample sub-sampled images generated in medical diagnosis, etc.).

In some embodiments, the preliminary model may include more sub-models other than the first model M1', the second model M2', and the second model M3'. For example, the preliminary model may also include a second model M4' corresponding to a lower sub-sampling rate than the second model M2'. As another example, the preliminary model may further include a third model corresponding to a higher sub-sampling rate than the first sub-sampling rate. In some embodiments, two or more sample reference full images may be used to train the preliminary model. In some embodiments, different sub-models may be trained using a same set or different sets of training samples.

Having thus described the basic concepts, it may be rather apparent to those skilled in the art after reading this detailed disclosure that the foregoing detailed disclosure is intended to be presented by way of example only and is not limiting.

Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C #, VB. NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. This method of disclosure, however, is not to be interpreted as reflecting an intention that the claimed subject matter requires more features than are expressly recited in each claim. Rather, claimed subject matter may lie in less than all features of a single foregoing disclosed embodiment.

We claim:

1. A method for magnetic resonance imaging (MRI) reconstruction, comprising:
   obtaining a plurality of sub-sampled images of a subject, wherein the plurality of sub-sampled images include a first sub-sampled image of the subject and one or more second sub-sampled images of the subject, the first sub-sampled image is generated using a first MRI sequence and a first sub-sampling rate, each of the one or more second sub-sampled images is generated using a second MRI sequence and a second sub-sampling rate, and the second sub-sampling rate is smaller than the first sub-sampling rate;
   obtaining an image reconstruction model having been trained according to a machine learning technique; and
   generating a first full image of the subject corresponding to the first MRI sequence based on the first sub-sampled image, the one or more second sub-sampled images, and the image reconstruction model.

2. A system for magnetic resonance imaging (MRI) reconstruction, comprising:
   at least one storage device including a set of instructions; and
   at least one processor configured to communicate with the at least one storage device, wherein when executing the set of instructions, the at least one processor is configured to direct the system to perform operations including:
   obtaining a plurality of sub-sampled images of a subject, wherein the plurality of sub-sampled images include a first sub-sampled image of the subject and one or more second sub-sampled images of the subject, the first sub-sampled image is generated using a first MRI sequence and a first sub-sampling rate, each of the one or more second sub-sampled images is generated using a second MRI sequence and a second sub-sampling rate, and the second sub-sampling rate is smaller than the first sub-sampling rate;

obtaining an image reconstruction model having been trained according to a machine learning technique; and generating a first full image of the subject corresponding to the first MRI sequence based on the first sub-sampled image, the one or more second sub-sampled images, and the image reconstruction model.

3. A non-transitory computer readable medium, comprising a set of instructions for magnetic resonance imaging (MRI) reconstruction, wherein when executed by at least one processor, the set of instructions direct the at least one processor to perform a method, the method comprising:

obtaining a plurality of sub-sampled images of a subject, wherein the plurality of sub-sampled images include a first sub-sampled image of the subject and one or more second sub-sampled images of the subject, the first sub-sampled image is generated using a first MRI sequence and a first sub-sampling rate, each of the one or more second sub-sampled images is generated using a second MRI sequence and a second sub-sampling rate, and the second sub-sampling rate is smaller than the first sub-sampling rate;

obtaining an image reconstruction model having been trained according to a machine learning technique; and generating a first full image of the subject corresponding to the first MRI sequence based on the first sub-sampled image, the one or more second sub-sampled images, and the image reconstruction model.

4. The method of claim 1, wherein the generating a first full image of the subject corresponding to the first MRI sequence based on the first sub-sampled image, the one or more second sub-sampled images, and the image reconstruction model comprises:

obtaining one or more reference full images of the subject each of which is generated using one of one or more third MRI sequences; and generating the first full image of the subject corresponding to the first MRI sequence based on the first sub-sampled image, the one or more second sub-sampled images, the image reconstruction model, and the one or more reference full image.

5. The method of claim 1, wherein the image reconstruction model comprises:

a first trained model configured to process the first sub-sampled image, and one or more second trained models each of which is configured to process one of the one or more second sub-sampled images.

6. The method of claim 5, wherein the first trained model corresponds to the first MRI sequence and the first sub-sampling rate, and each of the one or more second trained models corresponds to the second MRI sequence and the second sub-sampling rate of the second sub-sampled image processed by the second trained model.

7. The method of claim 6, wherein in the image reconstruction model, the first trained model and the one or more second trained models are arranged according to their respective sub-sampling rates in ascending order and sequentially connected.

8. The method of claim 7, wherein an input of the first trained model includes an output of each of the one or more second trained models.

9. The method of claim 5, wherein the generating a first full image of the subject corresponding to the first MRI sequence based on the first sub-sampled image, the one or more second sub-sampled images, and the image reconstruction model comprises:

for each of the one or more second sub-sampled images, generating a second full image by processing the second sub-sampled image using its corresponding second trained model; and generating the first full image by processing the one or more second full images and the first sub-sampled image using the first trained model.

10. The method of claim 9, wherein the one or more second sub-sampled images include a plurality of second sub-sampled images corresponding to a plurality of second sub-sampling rates, and for each of the one or more second sub-sampled images, the generating a second full image by processing the second sub-sampled image using its corresponding second trained model comprises:

generating a ranking result by ranking the plurality of second sub-sampled images according to their respective second sub-sampling rates in ascending order; and sequentially processing the plurality of second sub-sampled images in the ranking result to generate the plurality of second full images.

11. The method of claim 1, wherein the image reconstruction model is generated according to a model training process comprises:

obtaining a plurality of training samples each of includes a first sample sub-sampled image and one or more second sample sub-sampled images of the sample subject, the first sample sub-sampled image being generated based on the first MRI sequence and the first sub-sampling rate, and each of the one or more second sample sub-sampled images being generated based on one of the one or more second MRI sequences and one of the one or more second sub-sampling rates;

obtaining a preliminary model including a first model and one or more second models;

generating the one or more second trained models by training the one or more second models based on the one or more second sample sub-sampled images of each of the plurality of training samples; and generating the first trained model by training the first model based on the first sample sub-sampled image of each of the plurality of training samples and the one or more second trained models.

12. The method of claim 11, wherein each of the plurality of training samples further comprises one or more sample reference full images of the corresponding sample subject, each of the one or more sample reference full images being generated using one of the one or more third MRI sequences, and the one or more second trained models and the first trained model are generated further based on the one or more sample reference full images of each of the plurality of training samples.

13. The method of claim 11, wherein generating the first trained model by training the first model based on the first sub-sampled image of each of the plurality of training samples and the one or more second trained models comprises:

for each of the plurality of training samples, obtaining one or more predicted images corresponding to the one or more second MRI sequences based on the one or more second trained models and the one or more second sample sub-sampled images of the training sample; and generating the first trained model by training the first model based on the first sub-sampled image and the one or more predicted images of each of the plurality of training samples.

14. The system of claim 2, wherein the generating a first full image of the subject corresponding to the first MRI sequence based on the first sub-sampled image, the one or more second sub-sampled images, and the image reconstruction model comprises:

obtaining one or more reference full images of the subject each of which is generated using one of one or more third MRI sequences; and generating the first full image of the subject corresponding to the first MRI sequence based on the first sub-sampled image, the one or more second sub-sampled images, the image reconstruction model, and the one or more reference full image.

15. The system of claim 2, wherein the image reconstruction model comprises:

a first trained model configured to process the first sub-sampled image, and one or more second trained models each of which is configured to process one of the one or more second sub-sampled images.

16. The system of claim 15, wherein the first trained model corresponds to the first MRI sequence and the first sub-sampling rate, and each of the one or more second trained models corresponds to the second MRI sequence and the second sub-sampling rate of the second sub-sampled image processed by the second trained model.

17. The system of claim 15, wherein the generating a first full image of the subject corresponding to the first MRI sequence based on the first sub-sampled image, the one or more second sub-sampled images, and the image reconstruction model comprises:

for each of the one or more second sub-sampled images, generating a second full image by processing the second sub-sampled image using its corresponding second trained model; and generating the first full image by processing the one or more second full images and the first sub-sampled image using the first trained model.

18. The system of claim 17, wherein the one or more second sub-sampled images include a plurality of second sub-sampled images corresponding to a plurality of second sub-sampling rates, and for each of the one or more second sub-sampled images, the generating a second full image by processing the second sub-sampled image using its corresponding second trained model comprises:

generating a ranking result by ranking the plurality of second sub-sampled images according to their respective second sub-sampling rates in ascending order; and sequentially processing the plurality of second sub-sampled images in the ranking result to generate the plurality of second full images.

19. The system of claim 2, wherein the image reconstruction model is generated according to a model training process comprises:

obtaining a plurality of training samples each of includes a first sample sub-sampled image and one or more second sample sub-sampled images of the sample subject, the first sample sub-sampled image being generated based on the first MRI sequence and the first sub-sampling rate, and each of the one or more second sample sub-sampled images being generated based on one of the one or more second MRI sequences and one of the one or more second sub-sampling rates;

obtaining a preliminary model including a first model and one or more second models;

generating the one or more second trained models by training the one or more second models based on the one or more second sample sub-sampled images of each of the plurality of training samples; and generating the first trained model by training the first model based on the first sample sub-sampled image of each of the plurality of training samples and the one or more second trained models.

20. The method of claim 1, wherein each of the plurality of sub-sampled images is generated based on a fraction of full k-space data acquired by a sub-sampling technique.

* * * * *